(12) United States Patent
Kajiyama et al.

(10) Patent No.: US 9,687,937 B2
(45) Date of Patent: Jun. 27, 2017

(54) LASER ANNEALING METHOD AND LASER ANNEALING APPARATUS

(71) Applicant: V Technology Co., Ltd., Kanagawa (JP)

(72) Inventors: Koichi Kajiyama, Yokohama (JP); Michinobu Mizumura, Yokahama (JP)

(73) Assignee: V-TECHNOLOGY CO., LTD., Kanagawa (JP)

( * ) Notice: Subject to any disclaimer, the term of this patent is extended or adjusted under 35 U.S.C. 154(b) by 154 days.

(21) Appl. No.: 14/664,696

(22) Filed: Mar. 20, 2015

(65) Prior Publication Data

US 2015/0258630 A1 Sep. 17, 2015
US 2016/0279736 A9 Sep. 29, 2016

Related U.S. Application Data

(60) Division of application No. 13/310,024, filed on Dec. 2, 2011, now Pat. No. 9,012,338, which is a (Continued)

(30) Foreign Application Priority Data

Jun. 3, 2009 (JP) .................................. 2009-134181

(51) Int. Cl.
*H01L 21/3205* (2006.01)
*B23K 26/00* (2014.01)
(Continued)

(52) U.S. Cl.
CPC ...... *B23K 26/0066* (2013.01); *B23K 26/0006* (2013.01); *B23K 26/0081* (2013.01);
(Continued)

(58) Field of Classification Search
CPC ............ B23K 26/0066; B23K 26/0006; H01L 21/02675; H01L 21/02686
See application file for complete search history.

(56) References Cited

U.S. PATENT DOCUMENTS

| 5,463,200 A | 10/1995 | James et al. |
|---|---|---|
| 2001/0009251 A1 | 7/2001 | Sekizawa et al. |

(Continued)

FOREIGN PATENT DOCUMENTS

| JP | 2001-269789 | 10/2001 |
|---|---|---|
| JP | 2004-311906 | 11/2004 |

(Continued)

OTHER PUBLICATIONS

Preliminary Report on Patentability for PCT/JP2010/058787, mailed Dec. 15, 2011.

(Continued)

*Primary Examiner* — Duy T Nguyen
*Assistant Examiner* — Maria Ligai
(74) *Attorney, Agent, or Firm* — Finnegan, Henderson, Farabow, Garrett & Dunner, LLP (57) ABSTRACT

In the present invention, At least one row of lens arrays, in which a plurality of lenses are arranged in a direction intersecting with the conveying direction of a substrate to correspond to the plurality of TFT forming areas set in a matrix on the substrate, is shifted in the direction intersecting with the conveying direction of the substrate, to thereby align the lenses in the lens array with the TFT forming areas on the substrate based on the alignment reference position. The laser beams are irradiated onto the lens array when the substrate moves and the TFT forming areas reach the underneath of the corresponding lenses of the lens array, and the laser beams are focused by the plurality of lenses to anneal the amorphous silicon film in each TFT forming area.

2 Claims, 9 Drawing Sheets

Related U.S. Application Data continuation of application No. PCT/JP2010/058787, filed on May 25, 2010.

(51) Int. Cl.

| | |
|---|---|
| *H01L 21/02* | (2006.01) |
| *H01L 21/268* | (2006.01) |
| *H01L 29/66* | (2006.01) |
| *B23K 26/08* | (2014.01) |
| *H01L 27/12* | (2006.01) |
| *H01L 21/67* | (2006.01) |
| *B23K 103/00* | (2006.01) |

(52) U.S. Cl.
CPC ...... *B23K 26/083* (2013.01); *H01L 21/02422* (2013.01); *H01L 21/02488* (2013.01); *H01L 21/02532* (2013.01); *H01L 21/02675* (2013.01); *H01L 21/02686* (2013.01); *H01L 21/02691* (2013.01); *H01L 21/268* (2013.01); *H01L 21/67115* (2013.01); *H01L 21/67259* (2013.01); *H01L 27/1285* (2013.01); *H01L 29/66765* (2013.01); *B23K 2203/56* (2015.10)

(56) References Cited

U.S. PATENT DOCUMENTS

| | | | |
|---|---|---|---|
| 2003/0068836 A1 | 4/2003 | Hongo et al. | |
| 2003/0146475 A1* | 8/2003 | Lai | G03F 7/70633 |
| | | | 257/359 |
| 2004/0036969 A1* | 2/2004 | Taniguchi | G03B 21/56 |
| | | | 359/443 |
| 2006/0252261 A1* | 11/2006 | Tanaka | B23K 26/04 |
| | | | 438/662 |
| 2008/0057718 A1 | 3/2008 | Omata et al. | |

FOREIGN PATENT DOCUMENTS

| | | |
|---|---|---|
| JP | 2008-055467 | 3/2008 |
| KR | 2005-0119132 A | 12/2005 |
| KR | 2008-0053481 A | 6/2008 |
| WO | WO 2004/093174 A1 | 10/2004 |
| WO | WO 2007/043324 A1 | 4/2007 |

OTHER PUBLICATIONS

Office Action issued in U.S. Appl. No. 13/310,024, dated Aug. 8, 2014.

Korean Office Action dated Jun. 2, 2016 in Korean Application No. 10-2011-7027330, 9 pages total including translation.

* cited by examiner

LASER ANNEALING METHOD AND LASER ANNEALING APPARATUS

This application is a division of application Ser. No. 13/310,024, filed Dec. 2, 2011, which is a continuation of PCT/JP2010/058787, filed on May 25, 2010, each of which is incorporated herein by reference.

BACKGROUND OF THE INVENTION

1. Field of the Invention

The present invention relates to a laser annealing method for condensing laser beams by a microlens array to anneal only a thin-film transistor forming area of an amorphous silicon film. In particular, the present invention relates to a laser annealing method and a laser annealing apparatus for enhancing the irradiation position accuracy of laser beams by moving the microlens array following the movement of a substrate to be conveyed.

2. Description of Related Art

In a conventional laser annealing method, a plurality of laser beams is formed by a microlens array, and a focal point is formed for each beam, and each focal point of the beam is transferred to and imaged on an amorphous silicon film surface side, and laser processing is performed by irradiating the beams onto the amorphous silicon film surface, thereby recrystallization the amorphous silicon film in the thin-film transistor (hereinafter, referred to as "TFT") forming area (for example, refer to Japanese Laid-open Patent Publication No. 2004-311906).

However, in such a conventional laser annealing method, laser beams are focused by the microlens array and only the amorphous silicon film in a plurality of TFT forming areas is annealed, and hence, there is an advantage in that the use efficiency of the laser beams increases. However, there is no disclosure about; moving the microlens array following the movement of a substrate to be conveyed while meandering, positioning each lens in the microlens array at each TFT forming area, and irradiating the laser beams. Consequently, at the time of conveying and annealing a large substrate having a size of one meter or more on one side, when the substrate is conveyed while meandering, it can be difficult to anneal only each TFT forming area reliably due to the mechanical accuracy of a conveying mechanism.

SUMMARY OF THE INVENTION

In view of the above problems, it is an object of the present invention to provide a laser annealing method and a laser annealing apparatus that enhances the irradiation position accuracy of laser beams by shifting the microlens array following the movement of a substrate to be conveyed.

In order to achieve the above object, the laser annealing method of the present invention is a laser annealing method for annealing an amorphous silicon film in each of a plurality of thin-film transistor (hereinafter, referred to as "TFT") forming areas set in a matrix on a substrate with a predetermined array pitch, by focusing laser beams onto the TFT forming areas by a plurality of lenses in a lens array. According to the laser annealing method, an image on a surface of the substrate is captured by an imaging device while the substrate is being conveyed in either one array direction of horizontal and vertical directions of the TFT forming areas set in the matrix, and an alignment reference position preset on the surface of the substrate is detected based on the captured image. Then at least one row of lens arrays, in which a plurality of lenses are arranged in a direction intersecting with a conveying direction of the substrate to correspond to the plurality of TFT forming areas, is shifted in the direction intersecting with the conveying direction of the substrate, to align the lenses in the lens array with the TFT forming areas on the substrate based on the alignment reference position. The laser beams are then irradiated onto the lens array when the substrate moves and the TFT forming area reaches the underneath of a corresponding lens of the lens array.

According to this configuration, the image on the surface of the substrate is captured by the imaging device while the substrate is being conveyed in either one array direction of horizontal and vertical directions of the TFT forming areas set in the matrix, and the alignment reference position preset on the surface of the substrate is detected based on the captured image. Then at least one row of lens arrays, in which the plurality of lenses are arranged in the direction intersecting with the conveying direction of the substrate to correspond to the plurality of TFT forming areas, is shifted in the direction intersecting with the conveying direction of the substrate, to align the lenses in the lens array with the TFT forming areas on the substrate based on the alignment reference position. The laser beams are then irradiated onto the lens array when the substrate moves and the TFT forming areas reach the underneath of the corresponding lenses of the lens array, and the laser beams are focused by the plurality of lenses to anneal the amorphous silicon film in each TFT forming area.

Moreover, the lens array has such a configuration that the lens array includes a plurality of rows of lens arrays in which lenses are arranged in parallel in the direction intersecting with the conveying direction of the substrate with a pitch of an integral multiple of two or more of an array pitch of the TFT forming areas in the same direction, and a subsequent lens array is shifted by a predetermined dimension in a parallel arrangement direction of the plurality of lenses so as to fill a gap between the respective lenses in the lens array positioned at the head in the conveying direction of the substrate. Consequently, laser beams are focused onto the amorphous silicon film in each TFT forming area by the lens array having such a configuration that the lens array includes a plurality of rows of lens arrays in which lenses are arranged in parallel in the direction intersecting with the conveying direction of the substrate with a pitch of an integral multiple of two or more of the array pitch of the TFT forming areas in the same direction, and a subsequent lens array is shifted by a predetermined dimension in the parallel arrangement direction of the plurality of lenses so as to fill the gap between the respective lenses in the lens array positioned at the head in the conveying direction of the substrate.

Moreover, the substrate is a TFT substrate on which wiring lines are formed horizontally and vertically, and the TFT forming area is set at a crossing of the horizontal and vertical wiring lines, and the alignment reference position is set at an edge of the wiring line parallel to the conveying direction of the TFT substrate. Accordingly, alignment of the lenses in the lens array with the TFT forming areas on the TFT substrate is performed based on the alignment reference position set at the edge of the wiring line parallel to the conveying direction of the TFT substrate, on which the TFT forming area is set at the crossing of the horizontal and vertical wiring lines.

A laser annealing apparatus according to the present invention focuses laser beams onto a plurality of TFT forming areas set in a matrix on a substrate with a predetermined array pitch by a plurality of lenses in a lens array, and anneals an amorphous silicon film in each of the TFT forming areas. The laser annealing apparatus includes; a conveying device that conveys the substrate at a certain speed in either one array direction of horizontal and vertical directions of the TFT forming areas set in the matrix; a laser source that irradiates the laser beams; a lens array including at least one row of a plurality of condenser lenses, arranged in parallel in a direction intersecting with a conveying direction of the substrate in a plane parallel to a surface of the substrate to correspond to the plurality of TFT forming areas in the same direction; an imaging device that captures an image on the surface of the substrate, designating a position away from a focusing position of laser beams by the lens array by a certain distance in a direction opposite to the conveying direction of the substrate, as an image capturing position; an alignment device that aligns the lenses in the lens array with the TFT forming areas on the substrate by shifting the lens array in the direction intersecting with the conveying direction of the substrate; and a control device that controls drive of the respective components. The control device processes images sequentially input from the imaging device that captures the image on the surface of the substrate being conveyed, to detect an alignment reference position preset on the surface of the substrate, causes the lenses in the lens array to be aligned with the TFT forming areas on the substrate based on the alignment reference position, and controls the laser source to irradiate laser beams toward the lens array when the substrate moves and the TFT forming areas reach the underneath of the corresponding lenses in the lens array.

According to this configuration, the control device processes images sequentially input from the imaging device that captures the image on the surface of the substrate being conveyed, to detect the alignment reference position preset on the surface of the substrate, controls the drive of the alignment device to shift the lens array in the direction intersecting with the conveying direction of the substrate, causes the lenses in the lens array to be aligned with the TFT forming areas on the substrate based on the alignment reference position, and controls the laser source to irradiate laser beams toward the lens array when the substrate is moved by the conveying device and the TFT forming areas reach the underneath of the corresponding lenses in the lens array. The laser beam is then focused onto the plurality of TFT forming areas set in the matrix on the substrate with the predetermined array pitch by the plurality of lenses in the lens array, and the amorphous silicon film in each TFT forming area is annealed.

Moreover, the lens array has such a configuration that it includes a plurality of rows of lens arrays in which lenses are arranged in parallel in a direction intersecting with the conveying direction of the substrate with a pitch of an integral multiple of two or more of the array pitch of the TFT forming areas in the same direction, and a subsequent lens array is shifted by a predetermined dimension in a parallel arrangement direction of the plurality of lenses so as to fill a gap between respective lenses in the lens array positioned at the head in the conveying direction of the substrate. As a result, laser beams are focused onto the plurality of TFT forming areas by the lens array having such a configuration that the lens array includes a plurality of rows of lens arrays in which lenses are arranged in parallel in the direction intersecting with the conveying direction of the substrate with the pitch of the integral multiple of two or more of the array pitch of the TFT forming areas in the same direction, and the subsequent lens array is shifted by the predetermined dimension in the parallel arrangement direction of the plurality of lenses so as to fill the gap between respective lenses in the lens array positioned at the head in the conveying direction of the substrate.

Moreover the substrate is a TFT substrate on which a plurality of wiring lines are formed horizontally and vertically and the TFT forming area is set at a crossing of the plurality of wiring lines, and the alignment reference position is set at one edge of the wiring line parallel to the conveying direction of the TFT substrate. As a result, alignment of the lenses in the lens array with the TFT forming areas on the TFT substrate is performed based on the alignment reference position set at the edge of the wiring line parallel to the conveying direction of the TFT substrate on which each TFT forming area is set at the crossing of the horizontal and vertical wiring lines.

Advantageous Effects of the Invention

According to the invention of a first or fourth aspect, the microlens array can be moved following the movement of the substrate being conveyed, and hence, the irradiation position accuracy of the laser beams can be enhanced. Consequently, at the time of conveying and annealing a large substrate having a size of one meter or more on one side, even if the substrate is conveyed while meandering, only each TFT forming area can be annealed reliably with the mechanical accuracy of the conveying mechanism.

Moreover, according to the invention of a second or fifth aspect, the shape of each lens in the lens array can be made large to increase an intake of laser beams, thereby enabling to increase the irradiation energy of laser beams onto the amorphous silicon film. Consequently, the load on the laser source that irradiates the laser beams can be reduced, thereby enabling to enhance reliability of the apparatus.

Furthermore, according to the invention of a fourth or sixth aspect, while conveying the substrate, alignment of the lens with the TFT forming area can be constantly performed based on the edge of the wiring provided on the TFT substrate of a liquid crystal display panel or an organic EL display panel and extending continuously in the conveying direction of the substrate, thereby enabling to enhance the alignment accuracy of the lens with the TFT forming area.

DESCRIPTION OF THE PREFERRED EMBODIMENTS

Figure 1:
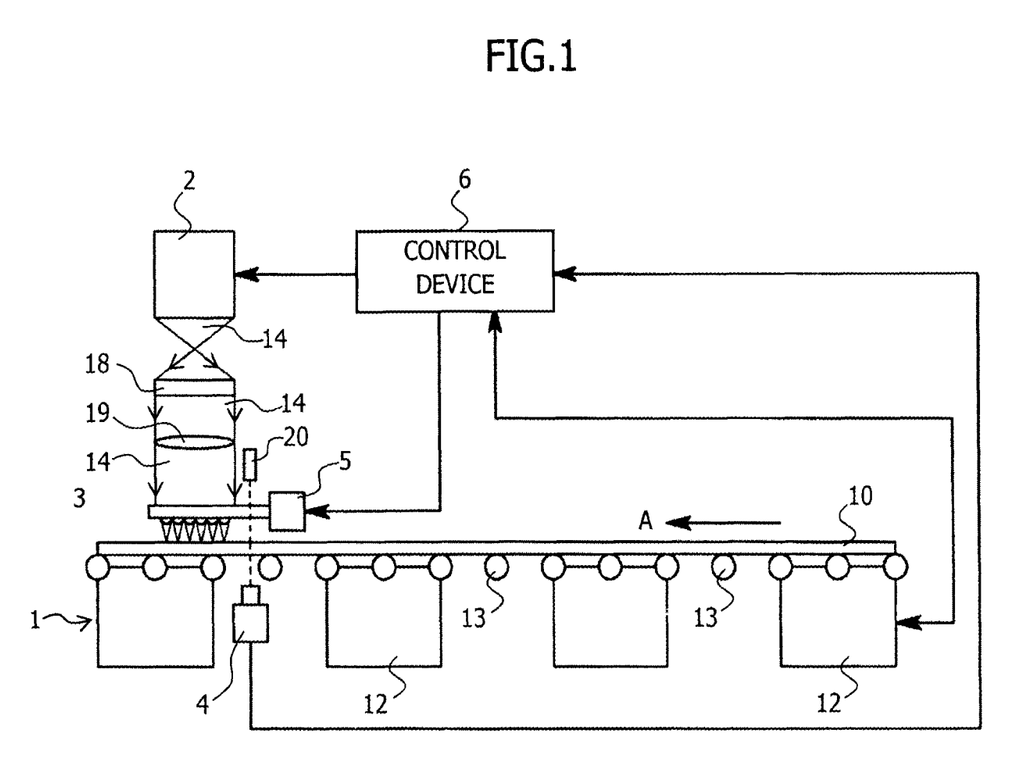
FIG. 1 is a schematic diagram showing an embodiment of a laser annealing apparatus according to the present invention.

An embodiment of the present invention is explained hereunder with reference to the accompanying drawings. FIG. 1 is a schematic diagram showing an embodiment of a laser annealing apparatus according to the present invention. The laser annealing apparatus is for focusing laser beams by a microlens array to anneal only a TFT forming area of an amorphous silicon film formed on a substrate, and includes a conveying device 1, a laser source 2, a microlens array 3, an imaging device 4, an alignment device 5, and a control device 6.

Figure 2:
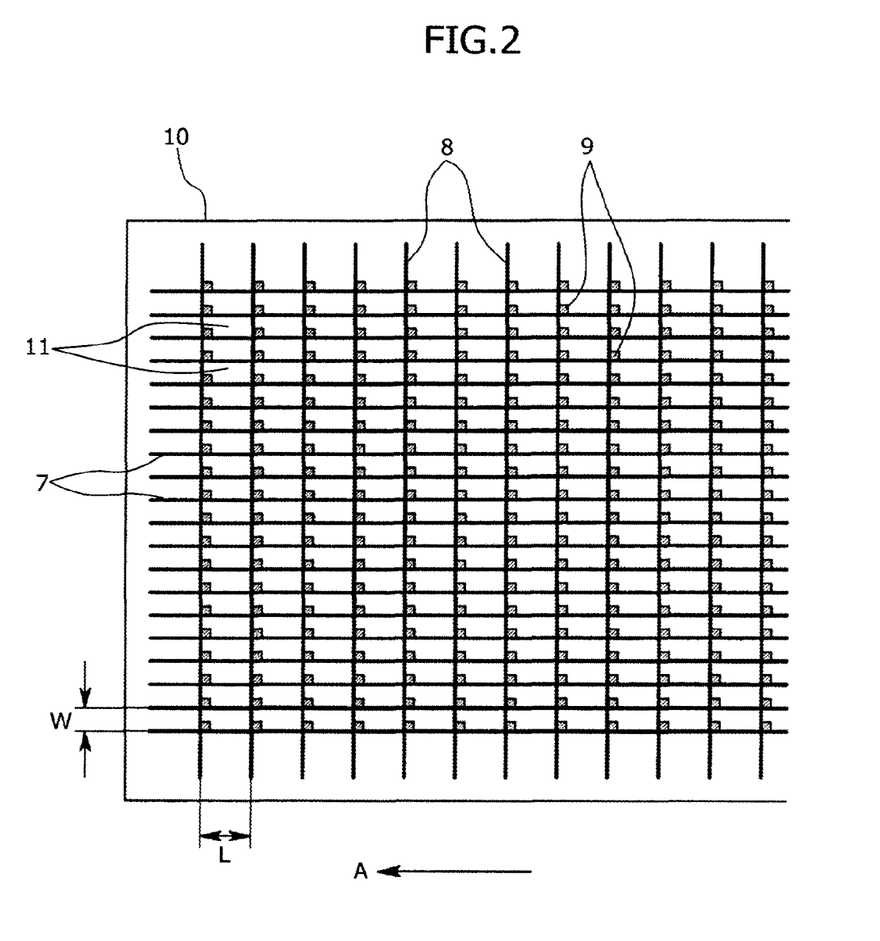
FIG. 2 is a plan view showing a TFT substrate to be used in the laser annealing apparatus according to the present invention.

Here, as shown in FIG. 2, the substrate is a TFT substrate 10 on which a plurality of data lines 7 and gate lines 8 are formed horizontally and vertically, and a TFT forming area 9 is set on a gate electrode 30 (refer to FIGS. 8A and 8B) at a crossing of the data line 7 and the gate line 8. A plurality of TFT forming areas 9 are set in a matrix with an array pitch (width W and length L in direction of arrow A) the same as that of pixels 11. On the TFT substrate 10, an alignment reference position is set, which becomes a reference for alignment of the TFT forming areas 9 with microlenses 15 in the microlens array 3 described later, for example, at an edge of the data line 7 parallel to the substrate conveying direction (direction of arrow A). Specifically, in the present embodiment, the alignment reference position is set at a right edge of the data line 7 located at a left end toward the substrate conveying direction (direction of arrow A). At this time, a horizontal distance between the right edge of the data line 7 and the center of the TFT forming area 9 is determined by a design value.

The conveying device 1 is for mounting the TFT substrate 10 on an upper surface thereof and conveying the TFT substrate 10 at a certain speed in either one array direction of horizontal and vertical directions of the TFT forming areas 9, for example, in the direction of arrow A in FIG. 2. A plurality of unit stages 12 having a plurality of ejection holes for ejecting gas and a plurality of suction holes for sucking gas in an upper surface thereof, is arranged parallel to the conveying direction of the TFT substrate 10 (hereinafter, referred to as the "substrate conveying direction"). The TFT substrate 10 is conveyed with both edges thereof being supported by conveyer rollers 13, in a state with the TFT substrate 10 being floated on the plurality of unit stages 12 by a certain amount due to a balance between ejection and suction of the gas.

The laser source 2 is provided above the conveying device 1. The laser source 2 is an excimer laser that irradiates laser beams 14 having a wavelength of, for example, 308 nm or 353 nm with a recurrence period of, for example, 50 Hz.

Figure 3A:
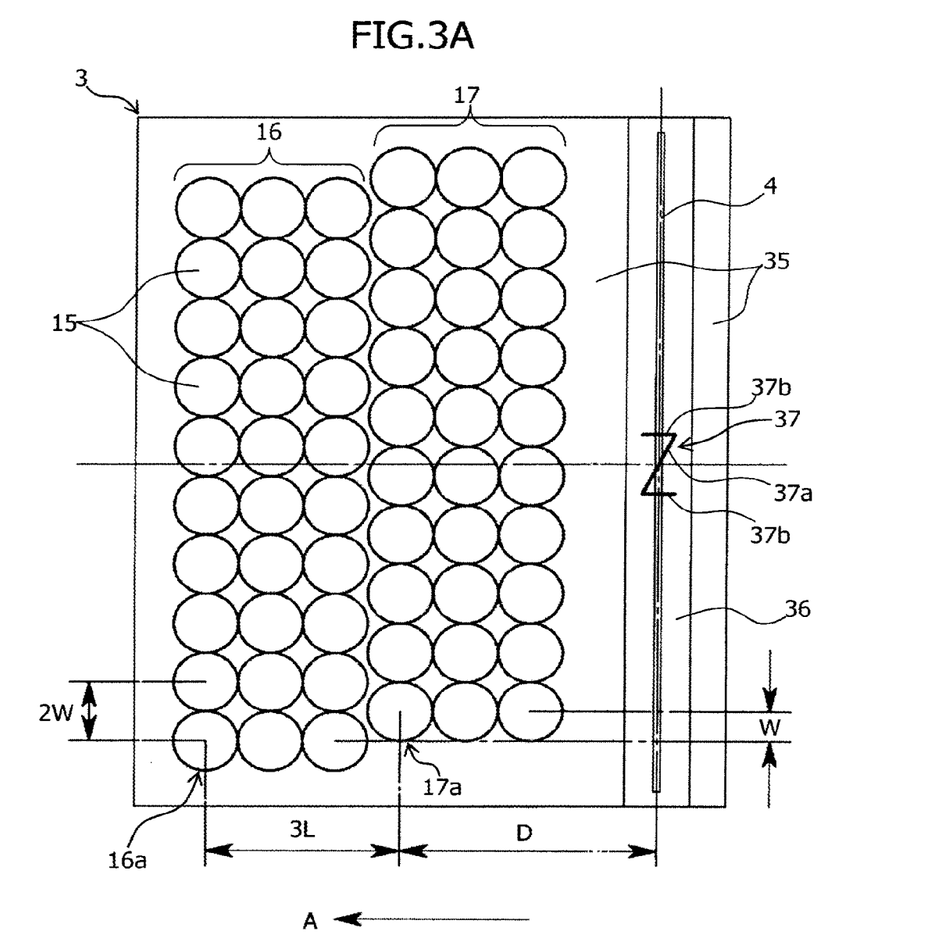
FIGS. 3A-3B is an explanatory diagram showing one configuration example of a microlens array constituting the laser annealing apparatus according to the present invention, showing the position in relation to an imaging device.

The microlens array 3 is provided on an optical path of the laser beams 14 irradiated from the laser source 2. The microlens array 3 is for focusing the laser beams 14 onto the plurality of TFT forming areas 9 set on the TFT substrate 10. The microlens array 3 has such a configuration that for example, six lens arrays, as shown in FIG. 3A, in which the microlenses 15 are arranged in parallel with a pitch of an integral multiple of two or more (shown by 2W in FIG. 3A) of an array pitch W of the severally set TFT forming areas 9, are arranged in parallel away from each other by a distance L, intersecting with the substrate conveying direction (direction of arrow A in FIG. 2) in a plane parallel to the TFT substrate 10. Moreover, the microlens array 3 has such a configuration that the subsequent three lens arrays (hereinafter, referred to as the "second lens group 17") are shifted by a predetermined dimension (shown by W in FIG. 3A) in a parallel arrangement direction of the microlenses 15 so as to fill the gap between respective lenses in the three lens arrays (hereinafter, referred to as the "first lens group 16") positioned at the head in the substrate conveying direction.

Figure 3B:
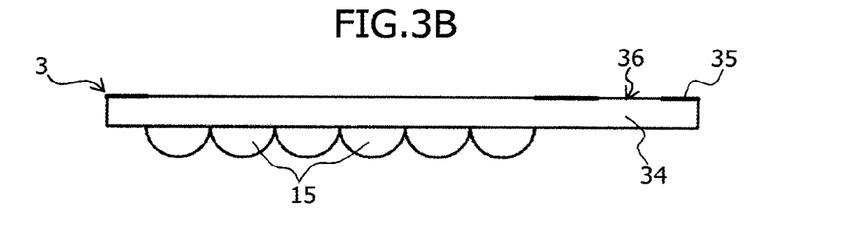

A specific configuration example of the microlens array 3 is such that, as shown in FIG. 3B, a plurality of microlens arrays 3 is formed on one surface of a transparent substrate 34, and an opaque shading film 35 having openings corresponding to the microlenses 15, is formed on the other surface thereof. Moreover, a long and thin aperture window 36 parallel to the lens array, is formed on the shading film 35 away from the second lens group 17 by a certain distance in a direction opposite to the substrate conveying direction. An N-shaped alignment mark 37 is provided in the aperture window 36. The alignment mark 37 is for position alignment with the TFT substrate 10, and a centerline of a diagonal fine line 37a parallel to the substrate conveying direction is matched with the center of the microlenses 15 in the first lens group 16 or the second lens group 17, and horizontally parallel fine lines 37b are arranged parallel to the substrate conveying direction. As a result, respective microlenses 15 in the microlens array 3 have a certain position relation with respect to the center of the alignment mark 37. That is to say, the respective microlenses 15 have such a relation that a horizontal distance with respect to the center of the alignment mark 37 in a direction orthogonal to the substrate conveying direction is nW (n is an integer equal to or larger than 1).

The imaging device 4 is provided between adjacent unit stages 12 of the conveying device 1 corresponding to the aperture window 36 of the microlens array 3. The imaging device 4 is for capturing an image of a wiring pattern formed on the surface of the TFT substrate 10 and an image of the alignment mark 37 of the microlens array 3 simultaneously, through the substrate from an underside of the TFT substrate 10, designating a position away from a focusing position of the laser beams 14 by the microlens array 3 by a certain distance in a direction opposite to the substrate conveying direction, as an image capturing position. The imaging device 4 is a line camera (line CCD) having a plurality of light receiving elements arranged linearly intersecting with the substrate conveying direction shown by arrow A in FIG. 3A. The imaging device 4 is provided, for example, away by a distance D from a lens array 17a of the second lens group 17 in the microlens array 3, which is positioned at the head in the substrate conveying direction, such that a centerline of a major axis of a linear light receiving surface is matched with the centerline of the alignment mark 37 of the microlens array 3 intersecting with the substrate conveying direction.

The alignment device 5 is provided so that the microlens array 3 can be moved in a direction intersecting with the substrate conveying direction. The alignment device 5 is for moving the microlens array 3 such that a distance between the alignment reference position preset on the data line 7 on the TFT substrate 10 (hereinafter, referred to as a "substrate-side alignment reference position") and a central position of the diagonal fine line 37a of the alignment mark 37 of the microlens array 3 (hereinafter, referred to as a lens-side alignment reference position) becomes a predetermined value, to align each microlens 15 in the microlens array 3 with the TFT forming area 9 on the TFT substrate 10. For example, the alignment device 5 includes a stage and a motor for moving the microlens array 3 in a direction intersecting with the substrate conveying direction (direction of arrow A). Moreover, another motor for rotating the microlens array 3 within a certain angular range centering on an optical axis thereof may be provided.

Reference symbol 18 in FIG. 1 denotes a homogenizer that homogenizes the intensity distribution in the cross-section of laser beams 14 irradiated from the laser source 2, and reference symbol 19 denotes a condenser lens that turns the laser beams 14 into parallel beams to be irradiated onto the microlens array 3. Moreover reference symbol 20 denotes an illuminating light source for illuminating an image capturing position of the imaging device 4.

Figure 4:
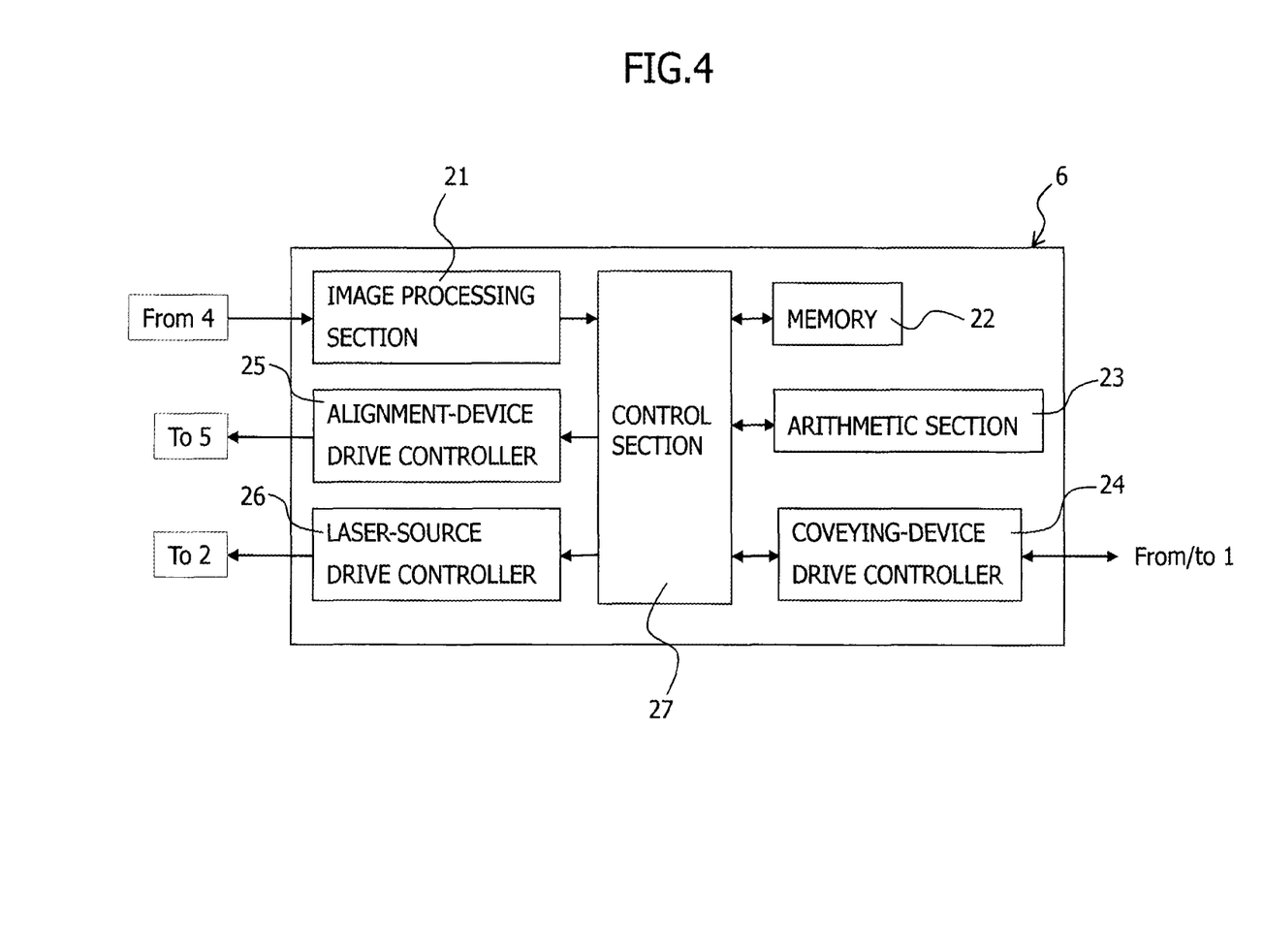
FIG. 4 is a block diagram showing one configuration example of a control device constituting the laser annealing apparatus according to the present invention.

The control device 6 is provided connected to; the conveying device 1, the laser source 2, the imaging device 4, and the alignment device 5. The control device 6 processes on a real time basis, the substrate surface and a one-dimensional image of the alignment mark 37 of the microlens array 3 simultaneously imaged by the imaging device 4, to detect the substrate-side alignment reference position set on the data line 7 on the TFT substrate 10 and the lens-side alignment reference position of the microlens array 3. The control device 6 then drives the alignment device 5 so that the distance between these alignment reference positions becomes the predetermined value, to move the microlens array 3 in the direction intersecting with the substrate conveying direction, and aligns each microlens 15 in the microlens array 3 with the TFT forming area 9 on the TFT substrate 10. After the TFT substrate 10 has moved a certain distance or a certain period of time has passed since it was detected that the edge of the gate line 8 on the TFT substrate 10 matched with the center of the alignment mark 37 based on the image captured by the imaging device 4, when the TFT forming areas 9 reach the underneath of the corresponding lenses in the microlens array 3, the control device 6 controls the laser source 2 to light up for a certain period of time and irradiate laser beams 14 onto the microlens array 3. As shown in FIG. 4, the control device 6 includes an image processing section 21, a memory 22, an arithmetic section 23, a conveying-device drive controller 24, an alignment-device drive controller 25, a laser-source drive controller 26, and a control section 27.

Here, the image processing section 21 detects a luminance change in the alignment direction (major axis direction) of a plurality of light-receiving elements in the imaging device 4 by processing the one-dimensional image captured by the imaging device 4 on a real time basis, to detect the substrate-side alignment reference position set on the data line 7 on the TFT substrate 10 and the lens-side alignment reference position of the microlens array 3, and detects that the edge of the gate line 8 on the TFT substrate 10 has matched with the center of the alignment mark 37 based on the image captured by the imaging device 4.

The memory 22 stores; a distance D between the imaging device 4 and the lens array 17a of the second lens group 17 in the microlens array 3, which is positioned at the head in the substrate conveying direction, a distance between the lens arrays 16a and 17a positioned respectively at the head in the substrate conveying direction of the first lens group 16 and the second lens group 17 in the microlens array 3 (for example, 3L in FIG. 3A), an alignment reference value for aligning the TFT substrate 10 with the microlens array 3, and a moving distance of the TFT substrate 10 or elapsed time since detection of the edge of the gate line 8 on the TFT substrate 10 until lighting of the laser source 2.

The arithmetic section 23 calculates a misregistration amount between the substrate-side alignment reference position of the TFT substrate 10 and the lens-side alignment reference position of the microlens array 3 detected by the image processing section 21.

The conveying-device drive controller 24 controls drive of the conveying device by a constant frequency pulse so that the TFT substrate 10 is conveyed at a certain speed.

The alignment-device drive controller 25 compares the misregistration amount between the substrate-side alignment reference position of the TFT substrate 10 and the lens-side alignment reference position of the microlens array 3 calculated by the arithmetic section 23 with the alignment reference value read from the memory 22, and drives the alignment device 5 so that these match with each other to shift the microlens array 3 in the direction intersecting with the substrate conveying direction.

The laser-source drive controller 26 controls lighting and extinction of the laser source 2. The control section 27 integrates and controls the whole components to operate appropriately.

An operation of the laser annealing apparatus configured in such a manner will be explained next.

At first, an input device such as a ten key is operated to store in the memory 22; the distance D between the imaging device 4 and the lens array 17a of the second lens group 17 in the microlens array 3, which is positioned at the head in the substrate conveying direction, the distance between the lens arrays 16a and 17a positioned respectively at the head in the substrate conveying direction of the first lens group 16 and the second lens group 17 in the microlens array 3, the alignment reference value for aligning the TFT substrate 10 with the microlens array 3, and the moving distance of the TFT substrate 10 or elapsed time since detection of the edge of the gate line 8 on the TFT substrate 10 until lighting of the laser source 2.

Next the TFT substrate 10 on which an amorphous silicon film is formed to cover the whole surface thereof, is mounted on an upper surface of the conveying device 1, so that the amorphous silicon film is upside and the data line 7 is positioned to become parallel to the conveying direction.

Then when a start switch is turned on, the conveying device 1 is pulse-controlled by the conveying-device drive controller 24 to convey the TFT substrate 10 in the direction of arrow A shown in FIG. 1 at a certain speed, in a state with the TFT substrate 10 being floated on the upper surface of the conveying device 1 by a certain amount.

Figure 5:
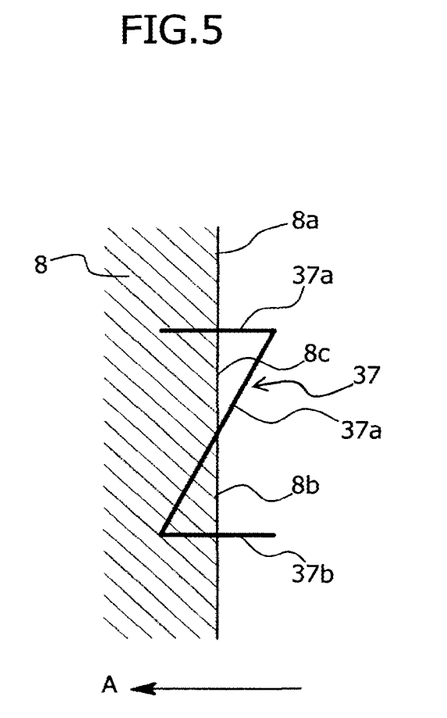
FIG. 5 is an explanatory diagram illustrating detection of an edge of a gate line on the TFT substrate.

Subsequently, when the TFT substrate 10 reaches a position above the imaging device 4, the imaging device 4 simultaneously captures images of the data lines 7 and the gate lines 8 formed on the surface of the TFT substrate 10 and the alignment mark 37 of the microlens array 3 through the TFT substrate 10. The one-dimensional images sequentially captured and input by the imaging device 4 are processed on a real time basis by the image processing section 21. As shown in FIG. 5, when it is detected that an edge 8a of the gate line 8 on the TFT substrate 10 matches with the center of the alignment mark 37 of the microlens array 3, the laser annealing apparatus counts the pulses of the conveying-device drive controller 24 based on the detection time, to start measurement of the moving distance of the TFT substrate 10, or starts to clock the elapsed time based on the detection time.

Here, matching of the edge 8a of the gate line 8 on the TFT substrate 10 with the center of the alignment mark 37 of the microlens array 3 can be detected, as shown in FIG. 5, by capturing the moment when the dimensions 8b and 8c on the right and left in the substrate conveying direction of the edge 8a of the gate line 8 between the opposite parallel fine lines 37b of the alignment mark 37 divided by the diagonal fine line 37a, become equal.

Figure 6:
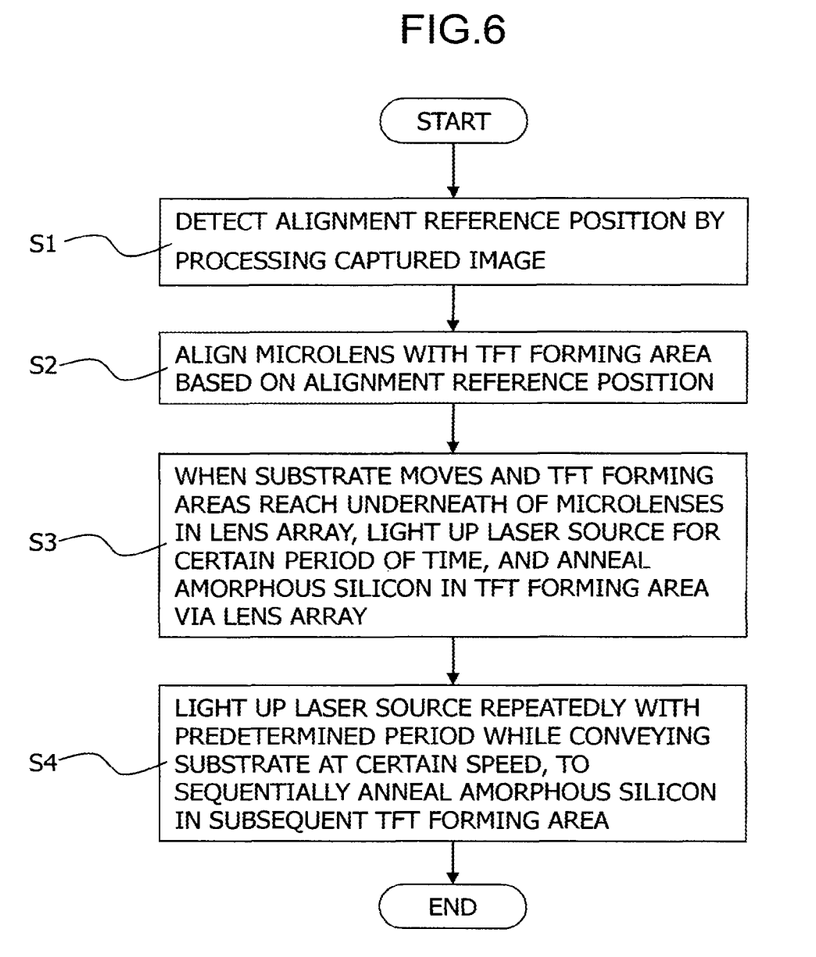
FIG. 6 is a flowchart illustrating a laser annealing method according to the present invention.

Hereunder, the laser annealing method of the present invention will be explained with reference to the flowchart in FIG. 6.

At first, in step S1, a one-dimensional image captured by the imaging device 4 is processed on a real time basis by the image processing section 21, to detect positions of the right edges of a plurality of data lines 7 in the substrate conveying direction and a central position of the diagonal fine line 37a of the alignment mark 37 of the microlens array 3 (the lens-side alignment reference position) by a luminance change in the alignment direction (major axis direction) of a plurality of light-receiving elements in the imaging device 4. Then, a position of the right edge of the data line 7, for example, at the left end in the substrate conveying direction, is specified as the substrate-side alignment reference position, from the detected right edges of the plurality of data lines 7.

In step S2, a misregistration amount between the specified substrate-side alignment reference position and the lens-side alignment reference position is calculated by the arithmetic section 23, and the misregistration amount is compared with the alignment reference value stored in the memory 22. Then the alignment device 5 is driven by the alignment-device drive controller 25 so that these match with each other, and the microlens array 3 is shifted in the direction intersecting with the substrate conveying direction to align the microlenses 15 with the TFT forming areas 9.

Figure 7A:
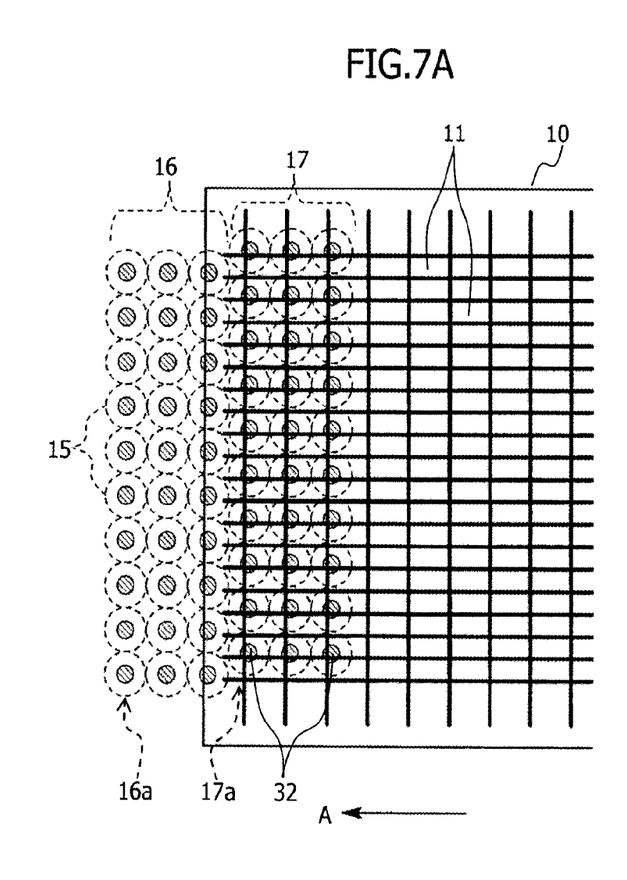
FIGS. 7A-7B is an explanatory diagram illustrating a situation in which the whole TFT forming areas on the TFT substrate are sequentially laser-annealed by the microlens array.
Figure 8A:
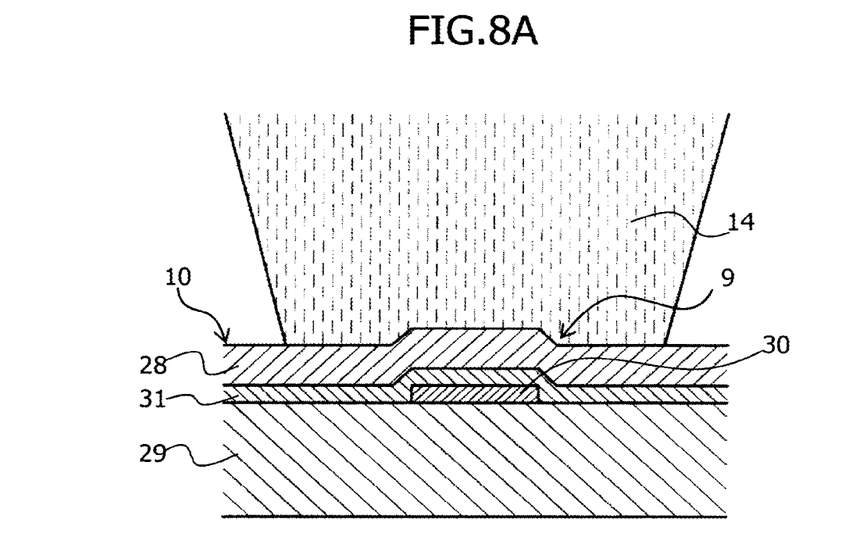
FIGS. 8A-8B is a sectional view for explaining an annealing process of the TFT forming area on the TFT substrate by the microlens array.
Figure 8B:
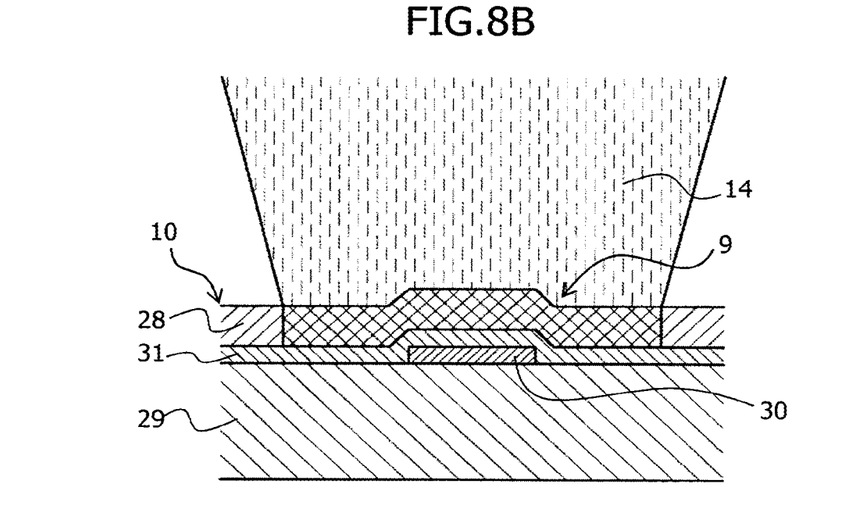

In step S3, after the TFT substrate 10 has moved a certain distance or a certain period of time has passed since it was detected that the edge 8a of the gate line 8 on the TFT substrate 10 positioned at the head in the conveying direction matched with the center of the alignment mark 37, then as shown in FIG. 7A, when one row of the TFT forming areas 9 positioned at the head in the conveying direction reaches the underneath of the lens array 17a at the head in the conveying direction of the second lens group 17 in the microlens array 3, the laser-source drive controller 26 is driven to light up the laser source 2 for a certain period of time to irradiate the laser beams onto the microlens array 3, and the amorphous silicon film in the TFT forming areas 9 corresponding to the second lens group 17 is annealed. Specifically, as shown in FIG. 8A, the laser beams 14 are focused onto the TFT forming areas 9 on the gate electrodes 30 by the microlenses 15, to anneal the amorphous silicon film 28 in the TFT forming areas 9. That is, due to the irradiation of the laser beams 14, the amorphous silicon film 28 in the TFT forming area 9 melts as shown in FIG. 8B, and thereafter the molten amorphous silicon film 28a is rapidly cooled and recrystallized simultaneously with extinction of the laser source 2, thereby forming a polysilicon film. At this time, the irradiation position of the laser beams 14 by the first lens group 16 is outside a forming area of the pixels 11, which becomes a so-called blind print. In FIGS. 8A and 8B, reference symbol 29 denotes a glass substrate, and 31 denotes a SiN insulating film.

Figure 7B:
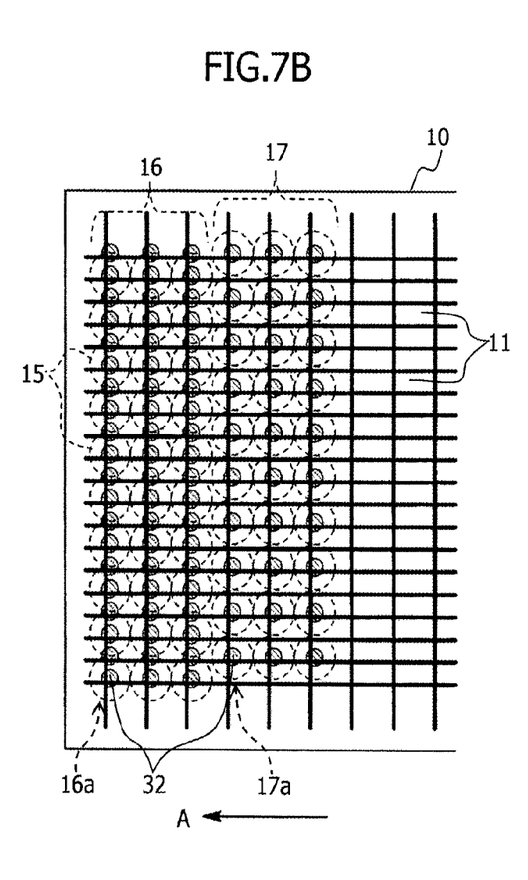

In step S4, the laser source 2 is driven to light up for a certain period of time by the laser-source drive controller 26, every time the conveying device 1 is pulse-controlled by the conveying-device drive controller 24 to move the TFT substrate 10 by a distance equal to the distance 3L between the lens arrays 16a and 17a positioned respectively at the head in the substrate conveying direction of the first lens group 16 and the second lens group 17 in the microlens array 3. As a result, the whole TFT forming areas 9 set on the TFT substrate 10 are sequentially annealed and polysiliconized, thereby forming a polysilicon film 32 (refer to FIGS. 9A-9C). FIG. 7B shows a state in which the TFT substrate 10 is moved by the distance 3L from the state in FIG. 7A, and the TFT forming areas 9 between the TFT forming areas 9 corresponding to the second lens group 17 are annealed by the first lens group 16.

In the present embodiment, alignment of the microlenses 15 in the microlens array 3 with the TFT forming areas 9 on the TFT substrate 10 in step S3 is executed constantly even while the TFT substrate 10 is being conveyed. Consequently, even if the TFT substrate 10 is conveyed while oscillating from side to side, the microlenses 15 can be positioned on the TFT forming areas 9 following the movement of the substrate. As a result, only the amorphous silicon film 28 in the TFT forming area 9 can be annealed reliably, to form the polysilicon film 32.

Figure 9A:
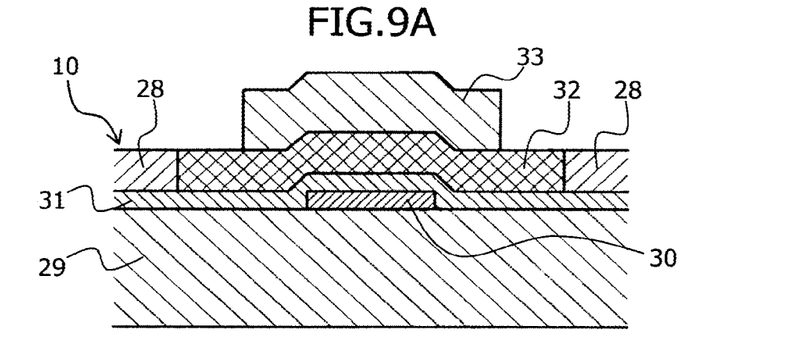
FIGS. 9A-9C is a sectional view for explaining a process for etching an annealed polysilicon film according to the laser annealing method of the present invention, to a certain shape.
Figure 9B:
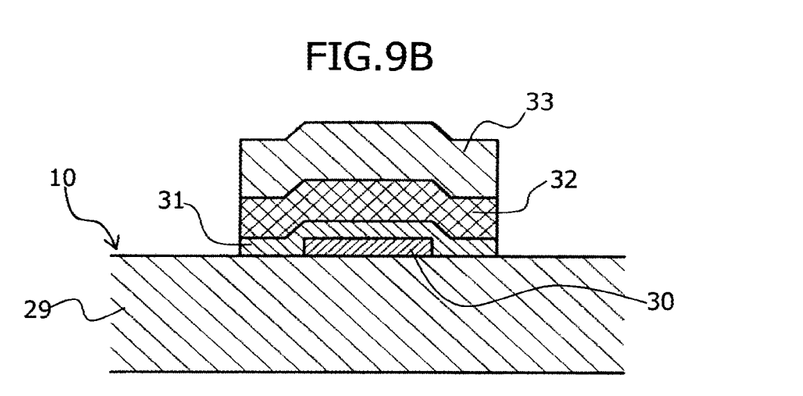
Figure 9C:
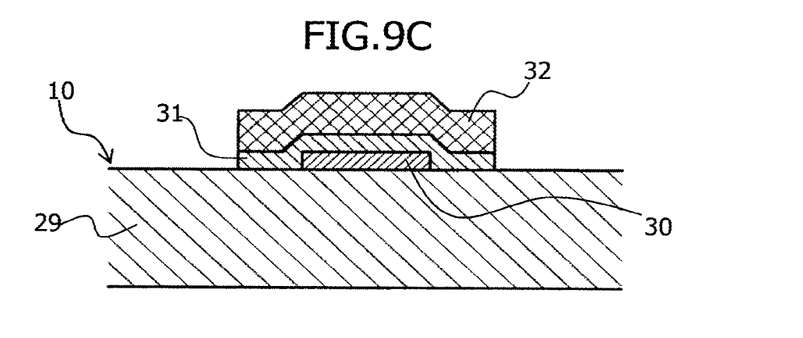

When annealing of the TFT substrate 10 is finished, then after a resist mask 33 having a certain shape is formed on the polysilicon film 32 on the gate electrode 30 as shown in FIG. 9A, the amorphous silicon film 28 and the polysilicon film 32 around the resist mask 33, and the SiN insulating film 31 formed underneath thereof are etched and removed, as shown in FIG. 9B, by a known etching technique. By removing the resist mask 33, as shown in FIG. 9 (c), the TFT substrate 10 on which the polysilicon film 32 having a certain shape is formed on the gate electrode 30 can be obtained. Thereafter, by forming a source electrode and a drain electrode on the polysilicon film 32, a low-temperature polysilicon thin-film transistor substrate is complete.

In the above-described embodiment, there is explained a case in which after the TFT forming areas 9 on the TFT substrate 10, on which the amorphous silicon film 28 is formed over the whole surface thereof, are annealed and polysiliconized, an unnecessary film around the polysilicon film 32 in the TFT forming area 9 is etched so that the polysilicon film 32 having the predetermined shape is left. However, the present invention is not limited thereto, and after the unnecessary film around the polysilicon film 32 in the TFT forming area 9 is removed so that the polysilicon film 32 having the predetermined shape is left, the remaining amorphous silicon film 28 can be annealed and polysiliconized.

In the above-described embodiment, there is explained a case in which the imaging device 4 is provided on the conveying device side, and images of the data lines 7 and the gate lines 8 on the substrate surface and the alignment mark 37 of the microlens array 3 are captured from the underside of the TFT substrate 10 through the substrate. However, the present invention is not limited thereto, and the imaging device 4 may be provided above the conveying device 1, so that the images of the data lines 7 and the gate lines 8 on the substrate surface and the alignment mark 37 of the microlens array 3 are captured from above.

Moreover, in the above-described embodiment, there is explained a case in which the microlens array 3 includes a plurality of rows of lens arrays in which the microlenses 15 are arranged in parallel in the direction intersecting with the substrate conveying direction with a pitch (2W) twice the array pitch W of the TFT forming areas in the same direction, and a subsequent lens array is shifted by W in the parallel arrangement direction of the plurality of microlenses 15 so as to fill the gap between the respective microlenses 15 in the lens array positioned at the head in the substrate conveying direction. However, the present invention is not limited thereto, and the microlens array 3 may include at least one lens array in which a plurality of microlenses 15 are arranged in parallel in the direction intersecting with the substrate conveying direction with the same pitch W as the array pitch W of the TFT forming areas in the same direction.

Furthermore, in the above-described embodiment, there is explained a case in which the alignment device 5 shifts the microlens array 3 in the direction intersecting with the substrate conveying direction. However, the present invention is not limited thereto, and the microlens array 3 and the imaging device 4 may be integrally moved.

Furthermore, in the above-described embodiment, there is explained a case in which the microlens array 3 is formed by one lens array having approximately the same length as the whole width of the TFT substrate 10 intersecting with the substrate conveying direction. However, the present invention is not limited thereto, and the microlens array 3 may be formed approximately in the same length as the above-described width by alternately arranging a plurality of unit lens arrays having a shorter length than the above-described width of the TFT substrate 10. In this case, one imaging device 4 may be provided, respectively, corresponding to each unit lens array.

In the above explanation, there is explained a case in which the substrate is the TFT substrate 10. However, the present invention is not limited thereto, and the substrate may be a semiconductor substrate.

It should be noted that the entire contents of Japanese Patent Application No. 2009-134181, filed on Jun. 3, 2009, on which the convention priority is claimed is incorporated herein by reference.

It should also be understood that many modifications and variations of the described embodiments of the invention will occur to a person having an ordinary skill in the art without departing from the spirit and scope of the present invention as claimed in the appended claims.

What is claimed is:

1. A laser annealing apparatus that focuses laser beams onto a plurality of TFT forming areas set in a matrix on a substrate with a predetermined array pitch by a plurality of lenses in a lens array, and anneals an amorphous silicon film in each of the TFT forming areas, the laser annealing apparatus comprising:

a conveying device that conveys the substrate at a certain speed in either one array direction of horizontal and vertical directions of the TFT forming areas set in the matrix;

a laser source that irradiates the laser beams;

a lens array including a plurality rows of lens arrays in which a plurality of condenser lenses are arranged in parallel in a direction intersecting with a conveying direction of the substrate in a plane parallel to a surface of the substrate with a pitch of an integral multiple of two or more of an array pitch of the TFT forming areas in the same direction, and a subsequent lens array is shifted by a predetermined dimension in a parallel arrangement direction of the plurality of lenses so as to fill a gap between respective lenses in the lens array positioned at a head in the conveying direction of the substrate;

an imaging device that captures an image on the surface of the substrate, designating a position away from a condensing position of laser beams by the lens array by a certain distance in a direction opposite to the conveying direction of the substrate, as an image capturing position;

an alignment device that aligns the lenses in the lens array with the TFT forming areas on the substrate by shifting the lens array in the direction intersecting with the conveying direction of the substrate; and a control device that controls drive of the respective components, wherein the control device processes images sequentially input from the imaging device that captures the image on the surface of the substrate being conveyed, to detect an alignment reference position preset on the surface of the substrate, causes the lenses in the lens array to be aligned with the TFT forming areas on the substrate based on the alignment reference position, and controls the laser source to irradiate laser beams toward the lens array when the substrate moves and the TFT forming areas reach the underneath of the corresponding lenses in the lens array.

2. A laser annealing apparatus according to claim 1, wherein the substrate is a TFT substrate on which a plurality of wiring lines is formed horizontally and vertically, and the TFT forming area is set at a crossing of the plurality of wiring lines, and the alignment reference position is set at one edge of the wiring line parallel to the conveying direction of the TFT substrate.

* * * * *